United States Patent [19]
Ikeya et al.

[11] Patent Number: 5,455,524
[45] Date of Patent: Oct. 3, 1995

[54] CMOS INTEGRATED CIRCUIT DEVICE AND DATA PROCESSING SYSTEM USING THE SAME

[75] Inventors: Toyohito Ikeya, Higashimurayama; Toshiro Takahashi, Ohme; Kazuo Koide, Iruma, all of Japan

[73] Assignee: Hitachi, Ltd., Tokyo, Japan

[21] Appl. No.: 184,067

[22] Filed: Jan. 21, 1994

[30] Foreign Application Priority Data

Jan. 20, 1993 [JP] Japan ................................. 5-024789

[51] Int. Cl.⁶ .............................................. H03K 19/0175
[52] U.S. Cl. ................... 326/73; 326/47; 326/50
[58] Field of Search ..................... 307/475, 443, 307/455, 303.1; 326/73, 50, 47

[56] References Cited

U.S. PATENT DOCUMENTS

| | | | |
|---|---|---|---|
| 4,992,681 | 2/1991 | Urakawa | 307/475 |
| 5,045,730 | 9/1991 | Cooperman | 307/475 |
| 5,068,551 | 11/1991 | Bosnyak | 307/475 |
| 5,216,298 | 6/1993 | Ohba | 307/475 |
| 5,264,744 | 11/1993 | Mizukami | 307/475 |
| 5,331,219 | 7/1994 | Nakamura | 307/475 |

OTHER PUBLICATIONS

ISSC 89, Digest Of Technical Papers, "High–Speed SRAMS", pp. 32–33; Feb. 15, 1989.

*Primary Examiner*—Edward P. Westin
*Assistant Examiner*—Andrew Sanders
*Attorney, Agent, or Firm*—Fay, Sharpe, Beall, Fagan, Minnich & McKee

[57] ABSTRACT

A CMOS LSI stably operates with high speed ECL LSI's to provide a data processing system. Two power sources of a negative ECL operation voltage and a positive CMOS operation voltage are provided. In a CMOS LSI, input signals of ECL level are successively amplified through an ECL input interface having a p-channel differential amplifier and an n-channel type differential amplifier, fed to the CMOS output buffer circuit and converted to the CMOS level, processed in a CMOS internal circuit, and output at the ECL level through output open-drain MOSFETs. The CMOS LSI is operated by two power sources which are level-shifted in correspondence with the ECL signal amplitude, instead of using ground potential and a positive voltage such as VDD.

27 Claims, 9 Drawing Sheets

CMOS INTEGRATED CIRCUIT DEVICE AND DATA PROCESSING SYSTEM USING THE SAME

BACKGROUND OF THE INVENTION

The present invention relates to a CMOS integrated circuit device, for a data processing system, in which input and output interfaces are adapted to ECL levels (emitter coupled logic).

The CMOS semiconductor integrated circuit device with input and output interfaced with the ECL levels can be a static RAM of a Bi-CMOS constitution, in which memory cells are constituted by CMOS circuits to accomplish a high degree of integration and a low power consumption, and in which ECL circuits are used as input and output circuits is disclosed in Suzuki, Makoto et al, ISSCC 89, Digest of Technical Papers, pp. 32–33, Feb. 15, 1989.

SUMMARY OF THE INVENTION

The present invention includes analysis of the prior art, its problem and causes of such problems, in addition to solutions to such problems.

The trend toward higher speed operation of the CMOS integrated circuit devices in recent years is making it possible to improve cost performance of ultrahigh-speed ECL integrated circuit devices by substituting CMOS integrated circuits for part of the ECL circuit. Conversely, even a CMOS integrated circuit device can increase speed by incorporating the ECL integrated circuit.

When a highly integrated CMOS integrated circuit constitutes part of a system that is otherwise constituted by the ECL integrated circuit, it is convenient to use an already designed gate array standard cell or module base. In this case, a level converter circuit is required for converting an ECL level of a negative small signal amplitude into a CMOS level or a positive large signal amplitude, causing complexity in the input/output interface and the operation speed to decrease.

The object of the present invention is to provide a CMOS integrated circuit device which realizes high speed and stable operation with a simple constitution and which is operable with ECL to provide a data processing system.

The present application uses two power source voltages: a negative operation voltage which corresponds to the ECL lower level and a positive operation voltage corresponding to the upper operation voltage of the CMOS circuit. Input signals of the ECL level are successively amplified through a p-channel differential amplifier and an n-channel differential amplifier to be converted into the CMOS level, processed in a CMOS internal circuit, fed to a CMOS output buffer circuit, and formed as output signals of the ECL level through open-drain output MOSFETs.

The CMOS circuit is operated by two power sources VS1, VS2, e.g. −2 V and +3 V, which are level-shifted corresponding to the ECL signal amplitude, instead of ground potential and a positive voltage such as VDD, whereby the input interface is two differential amplifiers connected in cascade, and the output interface has open-drain output MOSFETs.

BRIEF DESCRIPTION OF THE DRAWINGS

Further objects, features and advantages of the present invention will become more clear from the following detailed description of a preferred embodiment, shown in the accompanying drawings, wherein.

DETAILED DESCRIPTION

Figure 1:
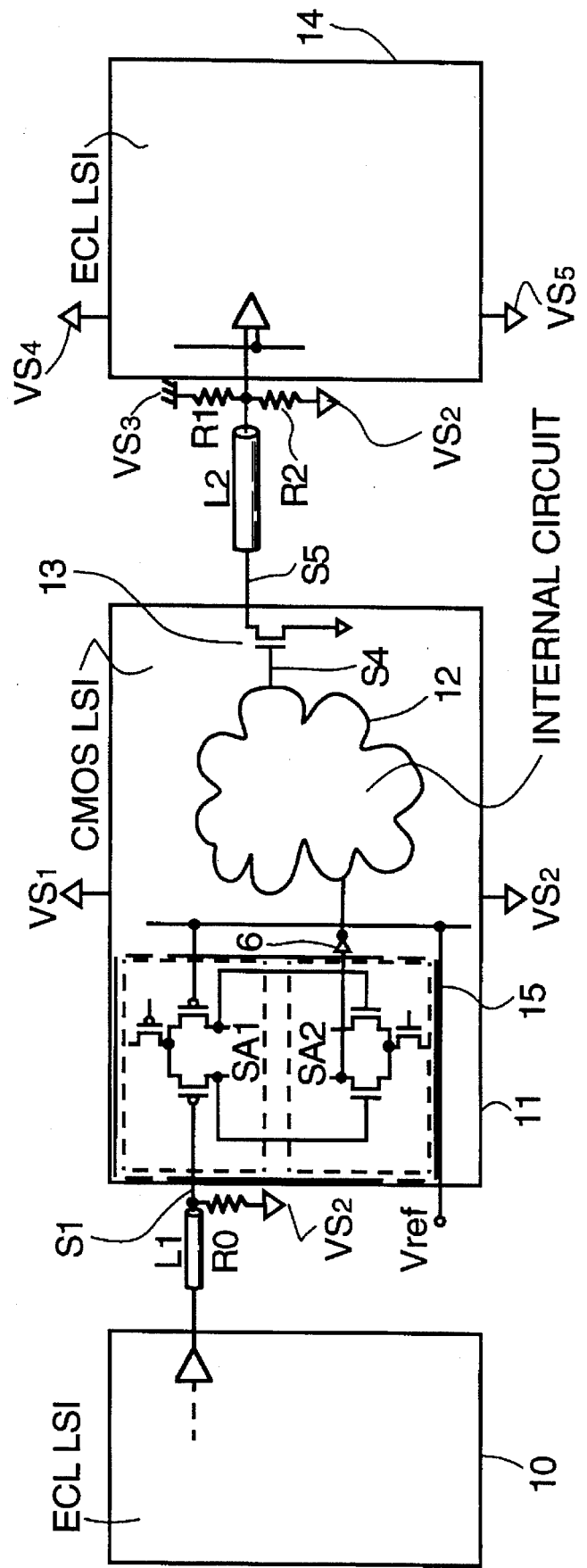
FIG. 1 is a partial block diagram illustrating an embodiment of a data processing system employing a CMOS integrated circuit device according to the present invention.

FIG. 1 is a partial block diagram of a data processing system using the single chip CMOS integrated circuit device 11 (CMOS LSI) according to the present invention. The output signal formed by the ECL integrated circuit device (ECL LSI) 10 is input to the CMOS LSI 11 through a transmission line L1. In FIG. 1 a variety of logic circuits, logic functions and modules designed for a variety of ASICs can be directly utilized as the internal circuit 12, facilitating design and production. Terminating resistor RO is connected between the end of the transmission line L1 and the power source VS2, e.g. −2 V that corresponds to the ECL lower level. A negative voltage of $VS_2$ corresponding to the ECL lower level is used as circuit ground potential and a positive potential of $VS_1$ (+3 V) is used as a reference, (instead of having the ground potential of the circuit different from the ECL lower level) so that the CMOS LSI 11 operates with a predetermined performance and so that the ECL level of a negative small amplitude can be efficiently converted into the CMOS level or that the CMOS level can be efficiently converted into the ECL level. In other words, the operation voltage of the CMOS circuit 11 is level-shifted by −2 V as a whole, whereby the CMOS circuit operates on a 5 V power source difference like that of the prior art and possesses a signal amplitude range of 5 V.

A level converter circuit to convert the ECL level signal S1 (0 to −2 V) into the CMOS level (−2 to 3 V) is an input interface 15 of a input stage differential amplifier SA1 using p-channel MOSFETs and an output stage differential amplifier SA2 using n-channel MOSFETs. The output signal of the output-stage differential amplifier SA2 is fed to the internal, data processing, CMOS internal circuit 12 through the CMOS inverter 6. The output signal S4 of the internal circuit 12 is fed through a CMOS output interface 13, which serves as an output buffer.

The CMOS internal circuit 12 is based on standard circuits that have already been designed, e.g. one or more of a gate array system, standard cell system and module base system, and exhibits desired logical functions by using a combination of the circuits. It is thus easy to design and manufacture a single chip CMOS circuit having required functions for a system that also includes ECL LSI's 10, 14 by using the standard, CMOS, existing arrays, cells or modules and by changing part of the connections.

An open-drain output MOSFET is used as the basic output interface 13. The ECL level output signal S5 of the drain of the output MOSFET is connected to the transmission line L2. The terminating resistors R1, R2 are provided between the end of the transmission line L2 and ECL power sources $VS_2$, (e.g. the negative voltage −2 V) and the ground potential VGND (e.g., 0 V) of the circuit 14, so that a signal S5 of the ECL level is fed to the ECL integrated circuit device (ECL LSI) 14.

Figure 2:
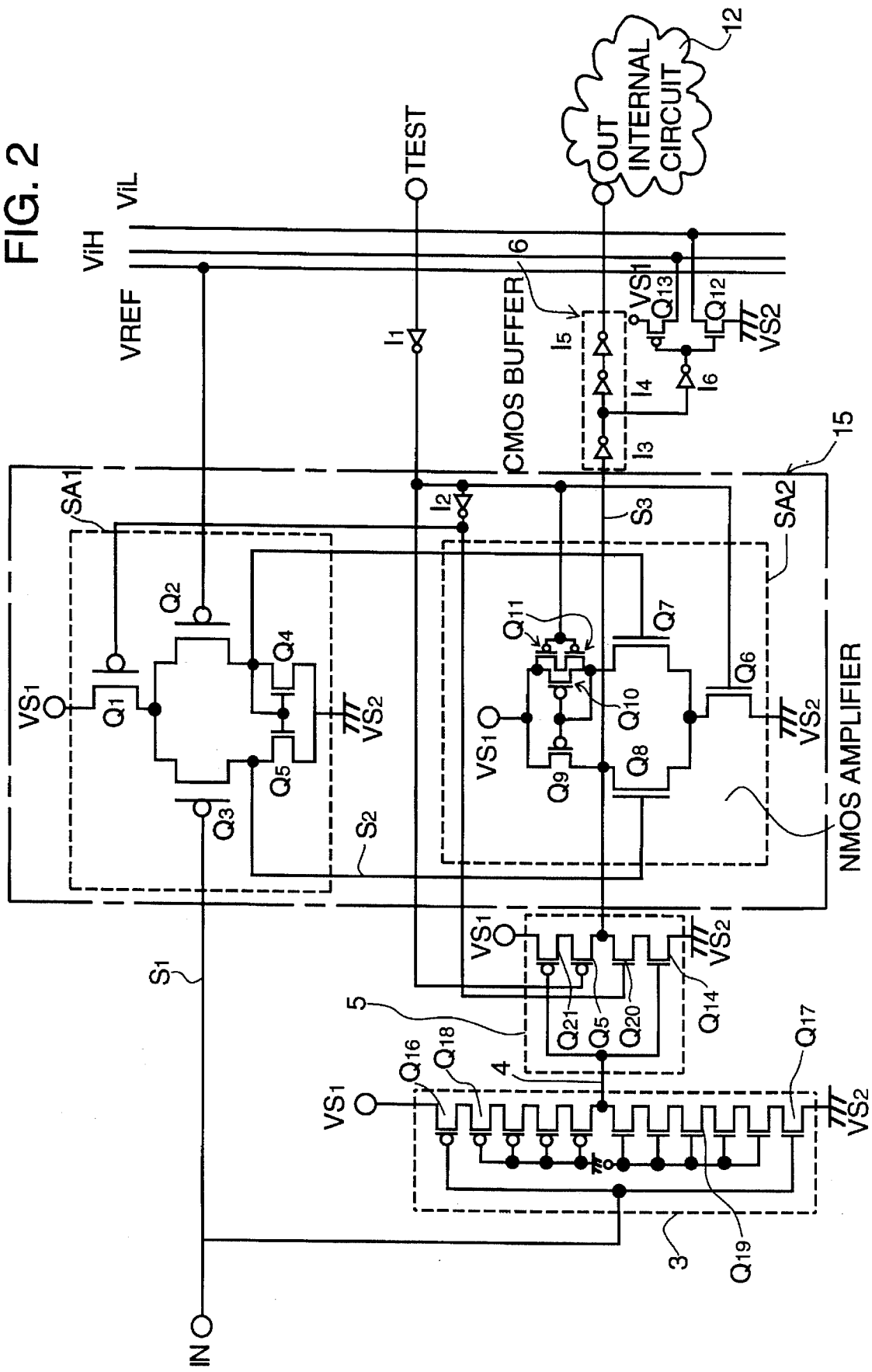
FIG. 2 is a detailed circuit diagram of the input interface circuit of FIG. 1.

FIG. 2 is a more detailed diagram of the input interface 15 of the CMOS LSI 11 of FIG. 1. The elements of FIG. 2 are all integrated on a single semiconductor substrate, such as single crystalline silicon, by a widely-known technology of fabricating CMOS integrated circuits. In this ECL input interface 15, a testing CMOS input interface circuit is provided so that the CMOS LSI 11 can be tested alone. In FIG. 2, the p-channel MOSFETs are marked with open circles at their gates to be distinguished from the n-channel MOSFETs.

The input terminal IN is connected to the gate of p-channel MOSFET $Q_3$ of differential amplifier SA1. A reference voltage VREF is fed to the gate of the other p-channel MOSFET $Q_2$, which is connected in a differential form with the MOSFET $Q_3$. The reference voltage VREF corresponds to an intermediate voltage, between the high and low levels of the input signal of the ECL level fed through the input terminal IN. A p-channel MOSFET $Q_1$ that works as a constant-current source is provided between the power source voltage $VS_1$ (e.g. +3 V) and common sources of the p-channel differential MOSFETs $Q_2$, $Q_3$. A test signal is fed through a test terminal TEST to the gate of the constant-current MOSFET $Q_1$ through the two inverter circuits $I_1$, $I_2$. A current mirror circuit constituted by n-channel MOSFETs $Q_5$, $Q_3$ is connected, as load to the drains of the p-channel differential MOSFETs $Q_3$, $Q_2$. The sources of the load MOSFETs $Q_4$, $Q_5$, are connected to the power source voltage $VS_2$, (e.g. −2 V).

The differential output signal of the first-stage differential circuit (PMOS amplifier) SA1 is fed to the gates of n-channel differential MOSFETs $Q_7$, $Q_8$, of the differential circuit (NMOS amplifier) SA2 of the output stage. An n-channel MOSFET $Q_6$ as a constant-current source is provided between the power source voltage $VS_2$ (e.g. −2V) and the commonly connected sources of the differential MOSFETs $Q_7$, $Q_8$. A test signal fed through the test terminal TEST is connected to the gate of the n-channel MOSFET $Q_6$ through inverter $I_1$. P-channel MOSFETs $Q_9$ $Q_{10}$ in the form of a current mirror are connected, as a load, to the drains of the n-channel differential MOSFETs $Q_7$ $Q_8$. A group of p-channel switching MOSFETs $Q_{11}$ is provided between the source and drain of the MOSFET $Q_{10}$. A test signal fed through the test terminal TEST is connected to the commonly connected gates of the switching MOSFETs $Q_{11}$ through inverter $I_1$. The output signal S3 of the output-stage differential amplifier SA2 is connected to the internal CMOS circuit 12 via a CMOS buffer circuit 6 constituted by three CMOS inverters $I_3$, $I_4$, $I_5$ connected in cascade and terminal OUT.

The ECL input interface 15 and internal CMOS circuit 12 undergo wafer-probing and varied tests before shipment, with a tester (not shown) for CMOS semiconductor integrated circuit devices, for example to perform the known IDDS standby current test. Test input interface 3, 4 for CMOSs is necessary for effecting the tests by such a CMOS tester.

An input inverter 3 has n-channel MOSFET $Q_{17}$ and p-type MOSFET $Q_{16}$, whose gates are commonly connected to the input terminal IN. P-channel MOSFETs $Q_{18}$ are connected in series between the drain of the p-channel MOSFET $Q_{16}$ and the output 4 as a resistor element by connecting their gates to the low source voltage $VS_2$ (of −2 V). N-channel MOSFETs $Q_{19}$ are connected in series between the drain of the n-channel MOSFET $Q_{17}$ and the output 4 as a resistor element by connecting their gates to the high source voltage $VS_1$ of +3 V.

The output signal 4 of the inverter circuit 3 is fed to a test switching circuit 5 constituted by two p-channel MOSFETs $Q_{15}$, $Q_{21}$ connected in series and two n-channel MOSFETs $Q_{14}$, $Q_{20}$ connected in series. The output signal 4 is fed to the gate of one p-channel MOSFET $Q_{21}$ and to the gate of one n-channel MOSFET $Q_{14}$. The test signal fed through the test terminal TEST is connected to the gate of the p-channel MOSFET $Q_{15}$ through inverter $I_1$ and the test signal is fed to the gate of the n-channel MOSFET $Q_{20}$ through the two inverters $I_1$, $I_2$.

When TEST has the high level, a test mode is established, which turns off the p-channel constant-current source MOSFET $Q_1$ of the PMOS amplifier SA1 and the n-channel constant-current MOSFET $Q_6$ of the NMOS amplifier SA2. Furthermore, the p-channel MOSFET group $Q_{11}$ is turned on in parallel with the MOSFET $Q_{10}$. The amplification operation of amplifier SA1, SA2 is discontinued since the constant-current sources $Q_1$, $Q_6$, for generating the amplifier operation current is turned off. The MOSFET $Q_{10}$ is turned off since the p-channel switching MOSFET group $Q_{11}$ is turned on. Thus, the output of the NMOS amplifier SA2 exhibits a high-impedance state. In the test mode (TEST high) the p-channel MOSFET $Q_{15}$ and the n-channel MOSFET $Q_{20}$ the CMOS level test switching circuit 5 are turned on, and the input signal 4 that has passed through the input inverter 3 is transmitted to the CMOS buffer 6 through the test switching circuit 5. In the test mode, therefore, the device functions as a CMOS level input semiconductor integrated circuit receiving the input signal S1 at IN.

For normal operation of the semiconductor integrated circuit device with an ECL input interface, the test terminal TEST is rendered low. Therefore, the p-channel MOSFET $Q_{15}$ and the n-channel MOSFET $Q_{20}$ of the test switching circuit 5 are turned off. Thus, the test switching circuit 5 is in the output high-impedance state irrespective of the signal 4. At TEST low, the constant-current MOSFETs $Q_1$, $Q_6$ are turned on, whereby the PMOS amplifier SA1 and the NMOS amplifier SA2 are activated to amplify the input signal S1 of the ECL level that is fed through the input terminal IN. The p-channel switching MOSFET group $Q_{11}$ is turned off by the TEST low signal, and a drain current of the n-channel differential MOSFETs $Q_7$, $Q_8$ flows through the p-channel current mirror circuit $Q_9$, $Q_{10}$ to perform the amplification operation.

Figure 3:
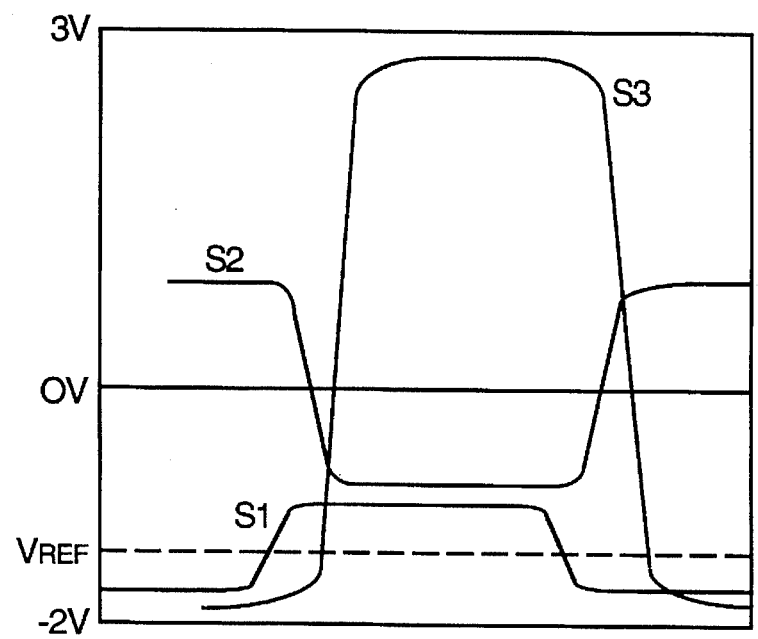
FIG. 3 is a diagram of signal waveforms for explaining the level conversion operation in the input interface circuit of FIG. 2.

FIG. 3 is a diagram showing signal waveforms for explaining the level conversion operation by the FIG. 2 input interface 15. The input signal S1 of ECL level has a small signal amplitude, its high level being e.g. −0.8 V and its low level being about −1.6 V. The signal S1 is shifted toward the low level compared to the above-mentioned CMOS operation voltages of −2 V and +3 V. Therefore, the amplification operation is carried out by using the p-channel differential MOSFETs $Q_2$, $Q_3$ as the first-stage PMOS amplifier SA1 that receives the ECL level input signal S1 and outputs amplified signal S2. Amplified signal S2 is obtained from the PMOS amplifier SA1.

If the signal S2 is directly fed to the CMOS buffer 6, erroneous operation would occur by variation in the amplitude of S2 due to noise since the gain of the PMOS amplifier SA21 is not large enough. Therefore, the signal S2 is amplified through the NMOS amplifier SA2 to a signal S3 having amplitude close to the CMOS level, which signal S3 is sent to the CMOS buffer 6. The NMOS amplifier SA2 receives the differential output S2 of the PMOS amplifier SA1 and effects the amplification to the CMOS level without any problem even when the amplitude of the signal SA2 is not up to CMOS level to some extent due to insufficient gain of the PMOS amplifier SA1.

Figure 4:
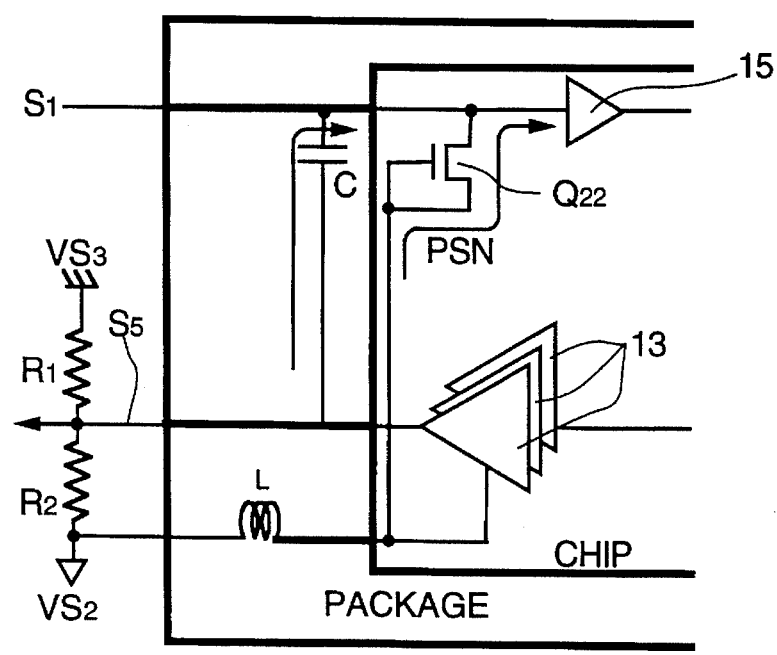
FIG. 4 illustrates the inventors analysis of conventional ECL input and output interfaces.
Figure 5:
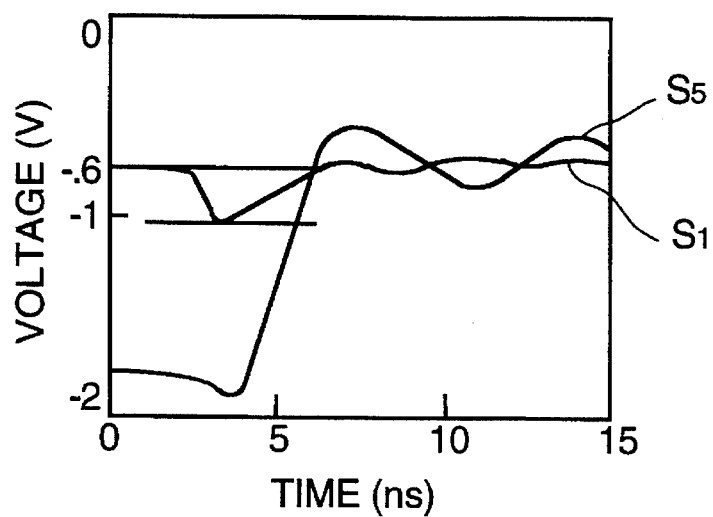
FIG. 5 is a diagram of waveforms for explaining the operation of the input and output interfaces of FIG. 4.

ECL level input signal S1 of a small amplitude is influenced by noise produced by coupling between the circuits 13 and 15 when such single chip integrated circuits are an LSI package. In a package of a chip having an ECL input level interface 15 and an ECL level output circuit 13 as shown in FIG. 4, power source noise PSN is generated through a surge protection MOSFET $Q_{22}$, and noise produced, when the ECL level output interface 13 sends an output signal from second stage amplifier SA2, leaks through parasitic capacitor C into the circuit of the ECL level interface input 15. As shown by a waveform diagram of FIG. 5, a change in the output signal S5 is transmitted as coupling noise N to the ECL level input interface 15 through the coupling parasitic capacitor C between the output line and the input line to deteriorate input margin.

Figure 6:
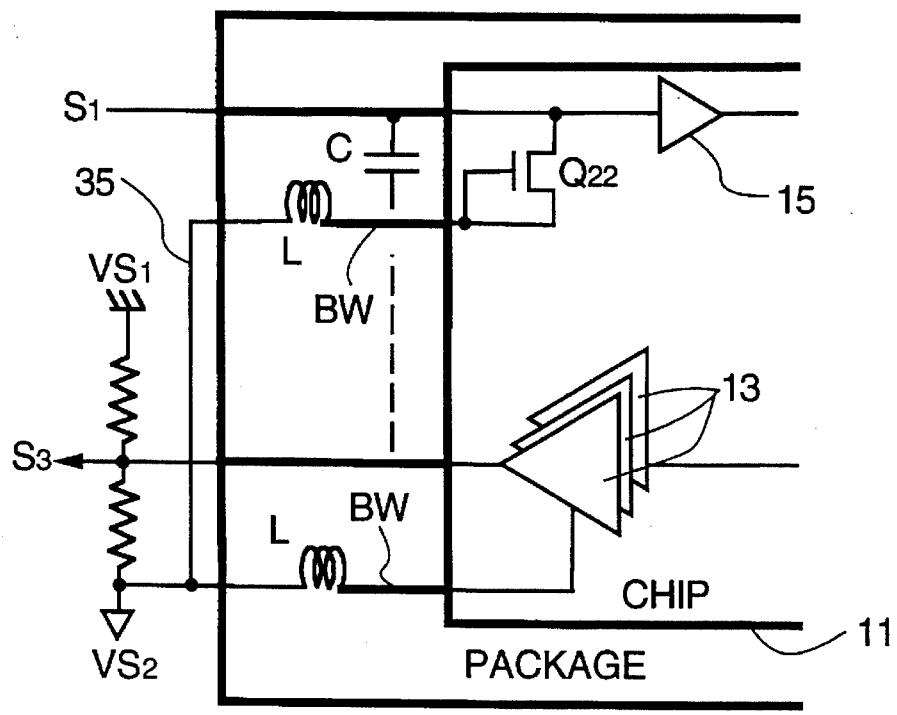
FIG. 6 is a block diagram of ECL input and output interfaces according to the present invention.

The MOS transistor $Q_{22}$ of FIG. 6 is a very large transistor to protect the circuit from voltage surges, for example a surge of 2,000 volts would be passed through the transistor $Q_{22}$, without damaging the ECL input circuit 15. The ECL level input interface circuit 15 is easily broken down, that is destroyed, by such a surge in voltage if it were not protected with the large MOS transistor $Q_{22}$ that passes the surge voltage to the voltage source line VS2, but as a result there is power source noise transmitted from the voltage source VS2 through the large MOS transistor $Q_{22}$ to the input line S1. In the actual packaging of the CMOS LSI 11, a plurality of ECL output circuits 13 are shown, which would correspond in number to the number of bus lines, which may be for example 4, 8, 16 or 32.

FIG. 6 is a block diagram which schematically illustrates the CMOS LSI package of FIG. 1, including amplifiers SA1, SA2. The low voltage power sources $VS_2$ (−2 V) of the circuits SA1, SA2 are separately provided inside the package and are connected to the same power source VS2 (−2 V) by a conductor 35, which is connected during packaging, i.e. outside the semiconductor integrated circuits of SA1 and SA2.

The single chip CMOS LSI 11 is provided with a large number of pins, or external terminals, for example 400–600. With respect to FIG. 2, VS1 for the PMOS amplifier SA1 is exclusively provided by a single aluminum conductor, in aluminum wiring level Al3 of FIG. 9, directly to an external pin 39 of FIG. 8, which external pin 39 is different from another external pin 39 that provides the VS1 voltage directly to the NMOS amplifier SA2. Similarly, the power source voltage VS2 for the PMOS amplifier SA1 is exclusively fed directly from an external pin 39 separate from another external pin 39 that directly provides the power source voltage VS2 to the NMOS amplifier SA2. This is very important, because the ECL level signal S1 is very small and the amplifiers SA1 and SA2 are such that they are easily influenced by any variation in power source voltage, that is power source voltage noise in coupled to S1, to undesirably change the output S3. Current demands of a circuit on a power source line can cause a fluctuation in the power source of perhaps 1 volt, without the present invention, but with the present invention separately providing power source lines to each of the amplifiers SA1, SA2 of the ECL level input circuit 15, the power source line voltage is steady since current demands are low. Thus, the power source lines from external pins 39 providing VS2 and VS1 (four such lines) are separate and dedicated, that is they are different from wiring providing the power source voltages VS1 and VS2 to other portions of the circuit shown in FIG. 2. Preferably, the inverter 3 has separate aluminum wiring directly from a dedicated external pin 39 to each of VS1 and VS2, respectively, as does the test switching circuit 5 and the CMOS buffer 6. In this manner, fluctuation of the voltage for the various power sources VS1 and VS2 is minimized and not transferred as noise to other power sources. Further, such aluminum wiring of the power sources is provided as shown in FIG. 9, by the power source aluminum wiring 96 for VS1 and VS2 and the reference power source aluminum wiring 97 for VRES in aluminum wiring layers AL2 and Al3, whereas the aluminum wiring for the internal connections of the CMOS circuit are constructed in aluminum wiring layer Al1, that is power source lines are restricted to wiring layers Al2 and Al3, whereas connection wiring of the circuits are restricted to a different layer Al1. The wiring 96 in wiring layer Al2 is chosen to be that of the most stable voltage source, that is the voltage source lines having the least current demands and therefore the least fluctuation in voltage. Therefore, any indirect couplings (such as inductive or capacitive) between layers Al2 and Al1 will pass little if any noise from Al3 to Al2, particularly to the ECL level input circuit 15. The wiring for the power sources having the most fluctuation in voltage are maintained in wiring layer AL3, which will have some capacitive coupling with layer AL2, and thus layer Al2 will effectively shield the sensitive wiring of layer Al1 from the noise of wiring of layer Al3. Particularly, the wiring 97 for conducting the reference voltage VREF is maintained in wiring layer AL3, to prevent that capacitive coupling to layer AL1. The ECL output circuit 13 of FIG. 10, to be described in detail later, has aluminum wiring, such as wiring 96 in layer Al3 of FIG. 9, rather than in layer Al2, because considerable current demands of the output circuit will cause relatively large fluctuations in the voltage of VS2; such fluctuations may be as much as one volt.

Figure 7:
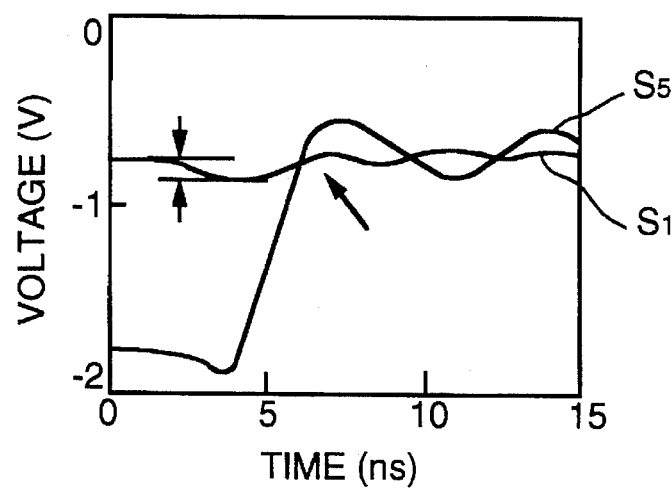
FIG. 7 is a diagram of waveforms for explaining the operations of the input and output interfaces of FIG. 6.

Isolation is accomplished as noted above and by inductance components L and the like of bonding wires BW 36 and lead terminals 38. As shown in the waveform diagram of FIG. 7, therefore, the power source noise PSN generated in the circuit SA2 is transmitted to the circuit SA1 through the protection MOSFET $Q_{22}$ can be greatly decreased by a factor of about ten.

The current of the constant-current source $Q_1$, $Q_6$ is simply switched by the differential transistors $Q_3$, $Q_8$ and, hence, no switching noise is superposed on the power source line. On the other hand, noise is superposed on the power source in correspondence with the switching current for switching the output signal S3 to the high level or the low level, and a sufficient countermeasure in separating voltages in view of the big MOS transistor Q22 of FIG. 6 against noise is desired for the CMOS LSI 11 that has the above-mentioned ECL level input interface 15.

Figure 8:
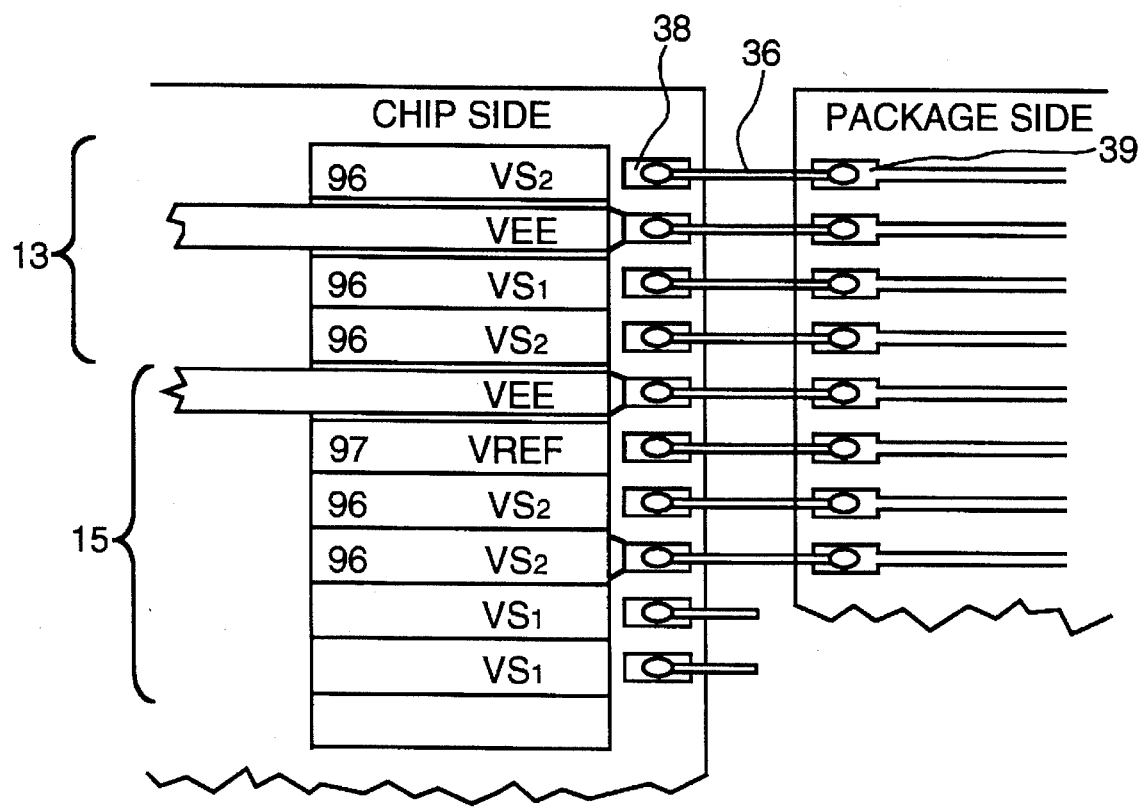
FIG. 8 schematically illustrates the arrangement of input and output interfaces wiring, pads and terminals of the CMOS LSI.
Figure 9:
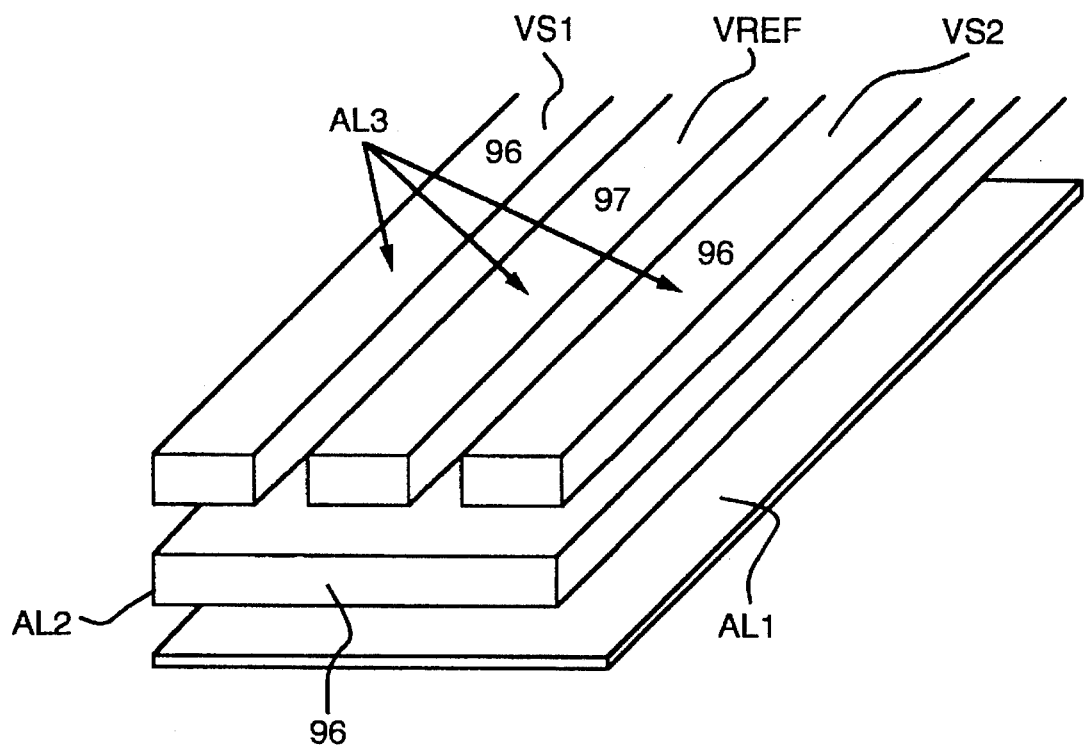
FIG. 9 is a diagram illustrating the wirings in the input and output interfaces of the CMOS LSI.

FIG. 8 is a diagram which schematically illustrates the physical layout, in plan view of the substrate, of the input and output interface voltage source connections of the CMOS LSI 11. On the single semiconductor chip of CMOS LSI 11, ECL level input and output circuits 15,13 are provided, each having exclusive power source wiring. The circuits 13,15 are isolated from each other by wells. In the CMOS LSI 11, various transistors for the ECL level input circuit 15 are formed in wells, for example an N substrate may have a P-well with a plurality of transistors formed therein. If these transistors in the same well were provided with different power sources, for example VS1 and VS2, respectively, then a current could flow from one of the transistors to the other through the well material so the current could grow in an uncontrolled manner to destroy the LSI according to the known phenomena called "latch up". Further, if these two transistors in the same well were provided with the same power source voltages (e.g. VS1 or VS1) through different power source wiring shown in FIG. 8, they may have their voltages differing from each other (due to fluctuation) by an amount sufficient to produce latch up. Therefore, in the present invention, whenever plural power source voltages are provided to respective plural transistors within a single well, such power source voltages come from the same aluminum wiring of AL2 or AL3 leading to a bonding pad 38 of the chip, which single bonding pad is then connected to the packaged side external pins 39 by bonding wire 36 as shown in FIG. 8. That is, the present invention separates power source lines, particularly within the ECL input circuits to obtain a stable signal, and assures that such separated lines do not lead to a single well, to prevent latch up.

Furthermore, as shown in FIG. 8, the aluminum wirings between chip bonding pads 38 and circuit components for the ECL level input circuit 15 are separated from the aluminum wiring leading from the chip bonding pads 38 to the ECL level output circuit 13, because the many separate ECL level output circuits 13 respectively for the separate lines of the output bus produce a large current drain, producing relatively large voltage fluctuations in the power source lines of the ECL level output circuits 13. It is desirable that these fluctuations not be directly connected electrically with or indirectly coupled by being physically adjacent to the power source wiring for the ECL level input circuit 15. Furthermore, as shown, at least some of the relatively stable voltage carrying aluminum wiring for VEE and VREF are maintained physically between the voltage source wiring VS2 and VS1 of the ECL level input circuit 15 and ECL level output circuit 13 to further isolate such circuits 13, 15 and prevent capacitive couplings of noise back to the sensitive input ECL circuit 15 as shown in plan view in FIG. 8. For the same reason, the aluminum wiring for the relatively stable voltages VEE and VREF are in the aluminum wiring layer AL2 to isolate the power source wirings 96, 97 of layer AL3 from the circuit connection wiring of layer Al1. The upper set of wires (marked 13) of FIG. 8 includes wiring of output circuits 13, and the lower set of wires (marked 15) includes wiring of input circuit.

The wiring 96 for feeding the power source VS2 provides shielding that decreases the coupling noise between the output signal S3 and the input signal S1. Placing the power source VS2 of wiring 96 in a position physically spaced between the input signal S1 and the output signal S3 obtains a shielding which helps to greatly decrease coupling noise due to the parasitic capacitance C between the output signal S3 and the input signal S1.

ECL level input signal S1 produced by the ECL LSI 10 is input through the external terminal IN and is used to determine a reference voltage VREF for the PMOS amplifier provided for the ECL level input interface 15. The wiring for power source VS2 that is provided for the output stage of NMOS amplifier SA2 are thereby isolated from the power source wiring for the input stage.

FIG. 9 is a diagram illustrating wiring 97 for the reference voltage VREF in the input interface 15 of the CMOS LSI 11. In order to prevent noise from being superposed on the reference voltage VREF, the reference voltage VREF is fed to the input circuits using wiring 97 of the third integration layer Al3, among three layers of aluminum wirings Al1 to Al3. The power sources VS1 and VS2 are fed by wirings 96 sandwiching the wiring 97, with insulation (not shown) therebetween. The wiring 96 constituted by the second aluminum layer Al2 is provided under the wirings of the layer Al3. Therefore, the wiring 97 that feeds the reference voltage VREF is shielded by the wirings 96 that feed the power sources VS1 and VS2, contributing to greatly decreasing the effect of coupling noise from other signal lines. The wiring connection of input circuit 15 is formed on the semiconductor chip in layer Al1.

Figure 10:
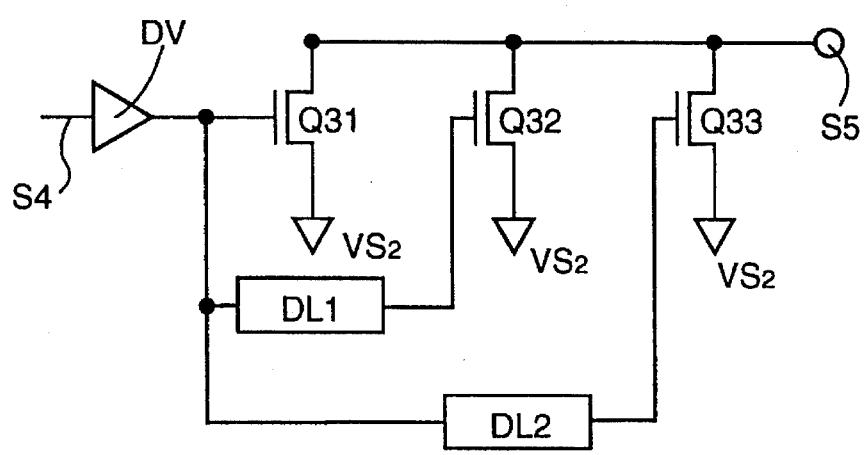
FIG. 10 is a simplified circuit diagram of an embodiment of an ECL output interface provided in the CMOS LSI.

FIG. 10 is a diagram of the ECL level output interface 13 provided in the CMOS LSI 11 of FIG. 1. In order to decrease distortion in the signal waveform, a plurality of open-drain output MOSFETs $Q_{31}$ to $Q_{33}$ are in parallel between the output terminal OUT of the CMOS LSI 11 and VS2. A driving signal S4 passed through a drive circuit DV is supplied to the gates with the delays created through delay circuits DL1 and DL2. That is, the MOSFET $Q_{31}$ is turned on at the earliest timing, the MOSFET $Q_{32}$ is turned on next and, finally, the MOSFET $Q_{33}$ is turned on. Since the MOSFET $Q_{31}$ is of small size, only a small drain current flows. Since the MOSFET $Q_2$ is larger than the MOSFET $Q_{31}$, an intermediate drain current flows. The MOSFET $Q_{33}$ has the largest size and largest drain current.

As the signal S5 at the output terminal OUT changes from the high level to the low level, the MOSFET $Q_{31}$ is turned on permitting a small drain current to flow. Thereby the output signal S5 slowly starts to change from the high ECL level to the low ECL level of VS2. Then, the MOSFET $Q_{32}$ is turned on to increase the drain current, which helps increase the rate of change to the low ECL level of VS2. Finally, the MOSFET $Q_{33}$ is turned on, so that the output terminal OUT is quickly set to the low ECL level of VS2. A power source voltage VS2 (−2 V) is thereby fed to the sources of the output MOSFETs $Q_{31}$ to $Q_{33}$. By stepwisely increasing the drain current as described above, it is possible to suppress the level of noise that is generated by the inductance components included in the power source lines 96,97 and the bonding wires 36 of FIG. 8 connected thereto. At the end of the transmission line L2 opposite to the end connected to the output terminal OUT of FIG. 10, as shown in FIG. 1, terminating resistors R1, R2 are connected to a grounding point (OV, VS3) of the circuit and to the power source voltage VS2 (−2 V). Therefore, when the MOSFETs $Q_{31}$ to $Q_{33}$ are turned off, the terminal resistors R2, R1 produces the high ECL level voltage such as −0.8 V. When the MOSFETs $Q_{31}$ to $Q_{33}$ are turned on, the low ECL level (−1.6 V) is produced by the terminating resistor R1, MOS- FETs $Q_{31}$–$Q_{33}$ and transmission line L2.

Figure 11:
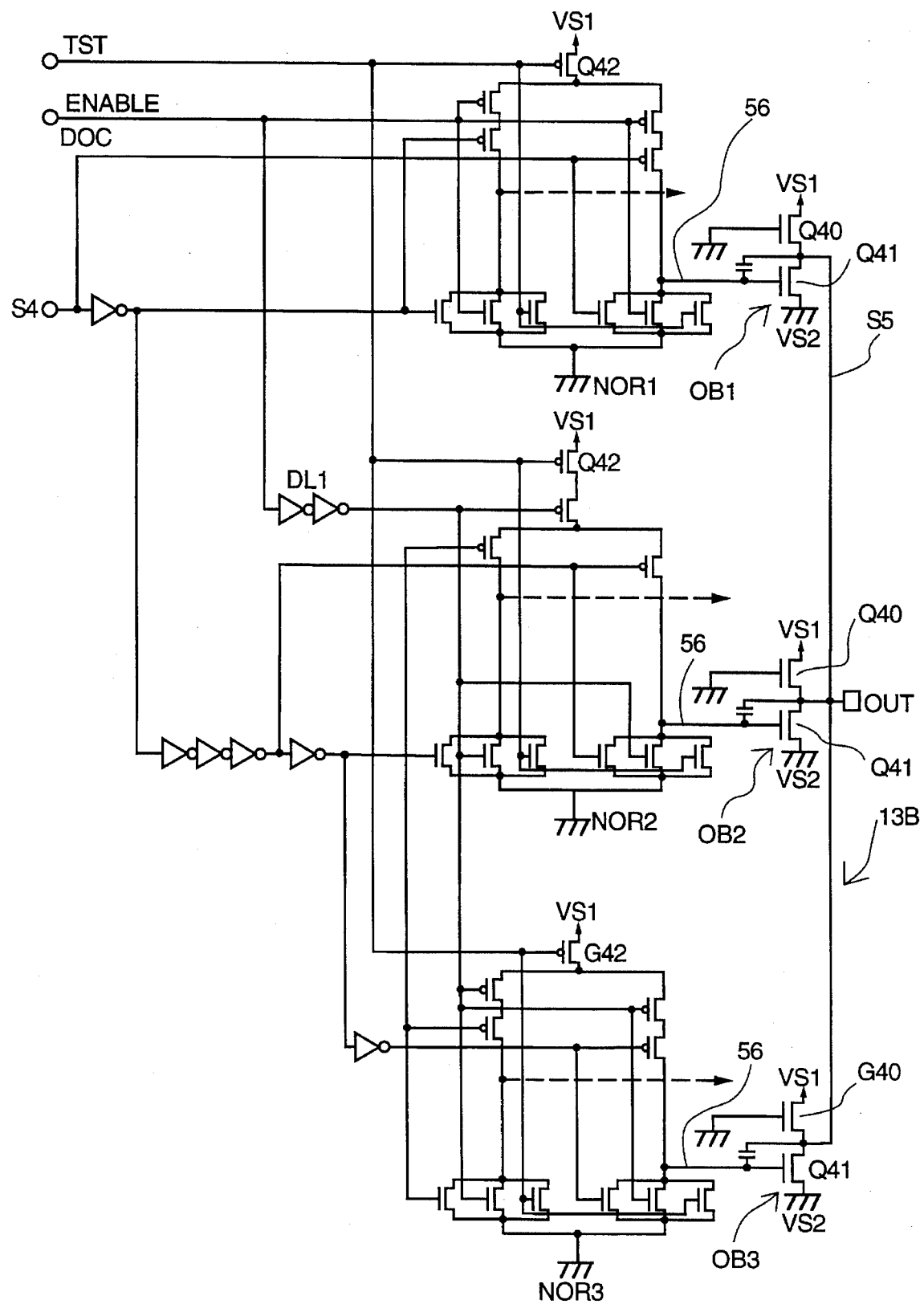
FIG. 11 is a detailed circuit diagram illustrating the ECL output interface using a basic CMOS output circuit.

FIG. 11 is a more detailed circuit diagram of the ECL output interface 13 of FIG. 1 utilizing the CMOS output interface 13B. In order to be operated at the CMOS level, wiring is provided for the gates of the MOSFETs of the power source side as indicated by a dotted line in FIG. 11, to operate it as a push-pull output circuit. As before, TEST is held low for normal operation, which turns on current sources $Q_{42}$. The gates of the output MOSFETs $Q_{40}$ of the power source high side are connected to ground potential of the circuit to be steadily off. Therefore, the open-drain constitution is established by the output MOSFETs $Q_{41}$ of the power source low-level side. Three output circuits are successively operated with time differences in order to decrease the noise, as in FIG. 10. Drive-stages are provided with NOR gates NOR1 and NOR3 for push-pull operation. A circuit that corresponds to the output MOSFET of the high-level side, out of the pair of NOR gates, is left behind as a dummy circuit with its output line unconnected and, hence substantially does not work.

The terminal TST of FIG. 11 is not the same terminal as the terminal TEST of FIG. 2, and they are involved in different tests and receive different signals. The CMOS LSI 11, contained on a single chip, has the ECL level input circuit 15 and ECL level output circuits 13 described to date, and this previously described ECL level input circuit 15 may be switched to be a CMOS level input circuit, according to the level of TEST. In addition, the ECL level output circuits 13 may be changed at the factory, to a CMOS level output circuit interface. As illustrated in FIG. 11, the interface 13B is an ECL level output, CMOS level input interface. To provide such a circuit with a CMOS level output, the dotted lines are connected to the gates, respectively of transistors $Q_{40}$ and the illustrated ground (VS2) connection of such gates is cut, to provide a push pull output. This is accomplished, during manufacturing by providing the wiring indicated in dotted lines for the gates of transistors $Q_{40}$ instead of VS2: that is, the wiring of the gates of transistors $Q_{40}$ to VS2 is cut for the CMOS level output interface and the wiring of such gates in dotted lines is cut to form the ECL level output interface (here the dotted lines indicate such cutting). Thereby, in the ECL level output interface, the transistors $Q_{40}$ and $Q_{42}$ will not be effective and the transistors $Q_{41}$ will provide open drain output. The line DOC is an enable, and when high such enable provides for the passage of data represented by the signal S4.

When a low signal S4 is produced with output control DOC low, the level is successively reached starting with the output signal of the NOR gate circuit NOR1 because of the combination of the output control circuit enable DOC and the output signal Do data OUT, thereby the output MOSFET $Q_{41}$ of the output circuit OB1 is turned on first, the output signal of the NOR gate circuit NOR2 changes to the high level due to the delay circuit constituted by the inverters, the output MOSFET of the output circuit OB2 is turned on, and finally the output signal of the NOR gate circuit NOR goes to the high level, turning on the output MOSFET $Q_{41}$ of the output circuit OB3. Like FIG. 10, therefore, an ECL signal of the low level is output.

In the above-mentioned normal operation mode, the test terminal TEST goes to the low level. When the test terminal TEST is high, the output signals S6 of the NOR gate circuits NOR1 to NOR3 all go to the low level of VS2, whereby the output MOSFET $Q_{41}$ is turned off to establish a high output impedance state.

Figure 12:
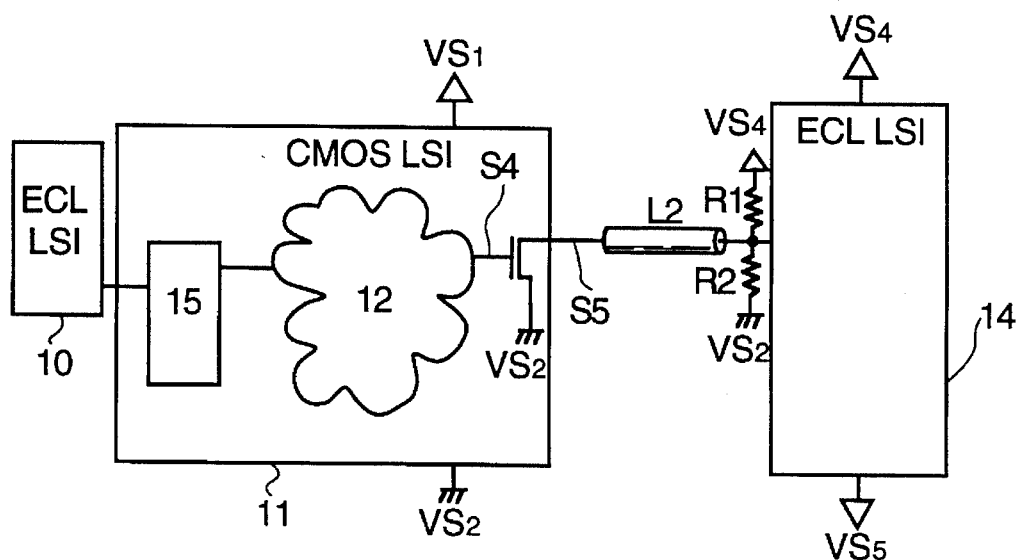
FIG. 12 is a block diagram illustrating a portion of the data processing system of FIG. 1 with different voltage sources.

FIG. 12 is a block diagram illustrating another example of power source voltage for the system of FIG. 1 for the data processing system according to FIG. 1. In this example, the ECL LSI has power source voltages VS4 (2 V) and VS5 (−2.5 V), and the CMOS LSI has two power source voltages of VS2 (0V) and VS1 (5 V). The output interface 13 of the CMOS LSI uses the open-drain output MOSFET. Terminating resistors R1, R2 are connected between the power source voltage VS4 (+2 V) and VS2 (ground potential 0 V of the circuit), on the end of the transmission lien L2. In FIG. 12 the relationship of the power source voltages between the CMOS LSI and the ECL LSI is the same as that of FIG. 1. This makes it possible to transmit signals as mentioned earlier.

Figure 13:
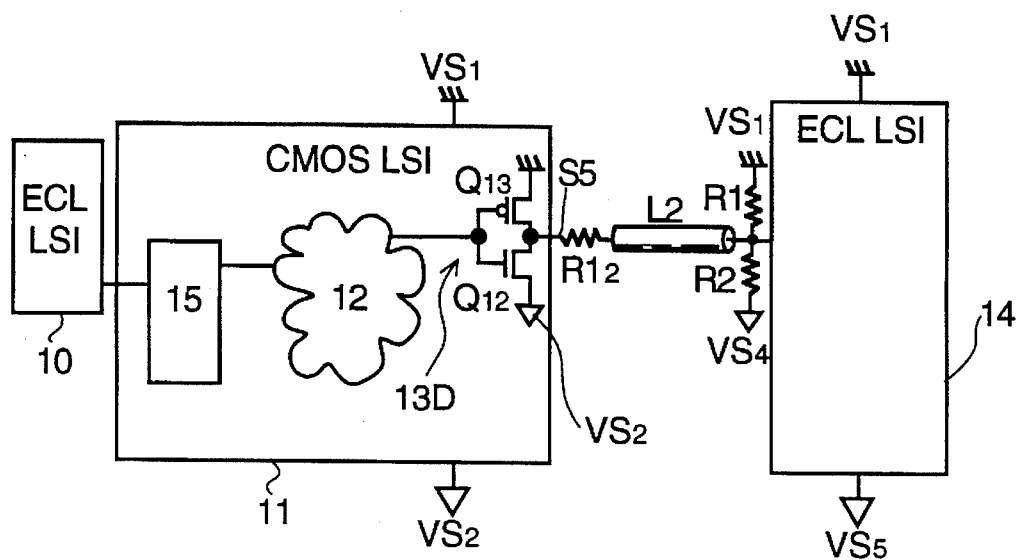
FIG. 13 is a block diagram variation of FIG. 12.

FIG. 13 is a block diagram illustrating another example of voltages applied to the circuit of FIG. 1 and a different ECL output interface 13D. The CMOS LSI uses power source voltages of VS2 (−5 V) and (0 V). In the CMOS LSI the internal circuit 12 forms a high level of 0 V and low level of −5 V. The output interface 13D converts such a modified CMOS level (0 V, −5 V) into the ECL level (0 V, −2 V). The output interface 13D is constituted by p-channel MOSFET $Q_{13}$ and n-channel MOSFET $Q_{12}$. The output interface 13D has a resistor R12 that is inserted in series with the transmission line L2, and has terminating resistors R1, R2 at the end of the transmission line L2 (the input of the ECL LSI 14), the resistors R1, R2 being connected between ground potential VS1 of the circuit (0V) and the power source voltage VS4 (−2 V); VS5 is −4.5 V.

In FIG. 13 the output signal S5 of the CMOS LSI is at the CMOS level (high level is 0 V and the low level is −5 V). When 0 V is output from the CMOS LSI to the series resistor R12, the transmission line L2 and the terminating resistors R1, Rs, the level of about −0.8 V is on the input of the ECL LSI 14 and when −5 V is output from the CMOS LSI, the level of the ECL LSI 14 input signal is about −1.6 V. The input interface 15 which receives the input signal S1 of the ECL level amplifies the high level (such as −0.8 V) and the low level (such as −1.6 V) to convert them into the CMOS level (for example, 0 V and −5 V), and can hence be constituted by using the two stages of differential amplifiers SA1, SA2. In this case, the amplitude of the ECL input signal S1 is shifted toward the high-level side (−0.8 V/−1.6 V) when the operation voltage VS2 of the CMOS LSI 11 is −5 V. Therefore, the differential amplifier SA1 of the input stage should use n-channel differential MOSFETs, and the output stage should be a differential amplifier SA2 that uses p-channel differential MOSFETs.

Figure 14:
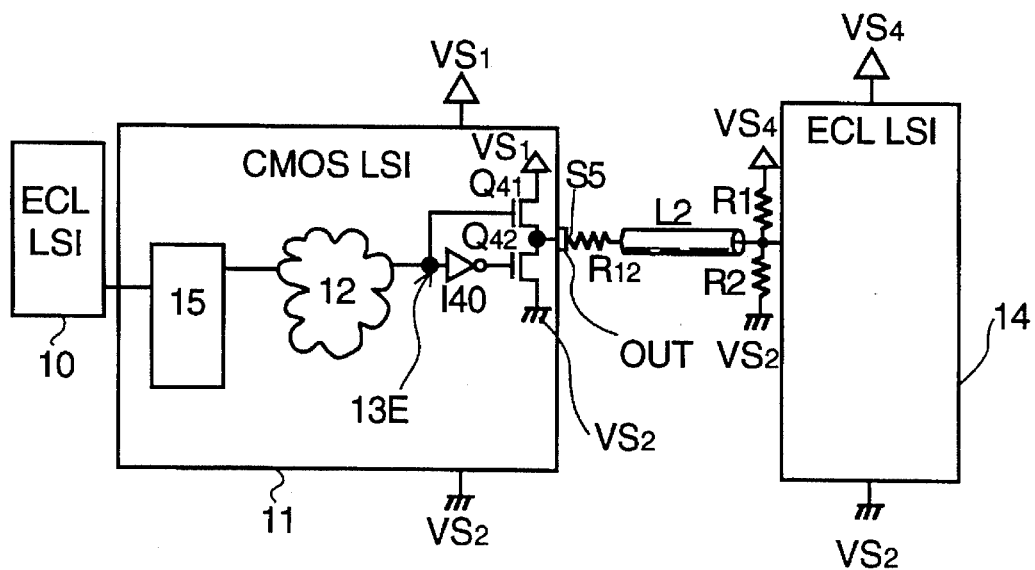
FIG. 14 is a block diagram variation of FIG. 12.

FIG. 14 illustrates still another embodiment of the output interface 13E. The ECL LSI 14 uses a positive power source VS2 and VS4 (of 0 V and 4.5 V). The high level is set to be 4.5 V−0.8 V=3.7 V and the low level is set to be 4.5 V−1.6 V=2.9 V. The output interface 13E uses an inverted push-pull output circuit constituted by n-channel output MOSFETs $Q_{41}$, $Q_{42}$ of the push-pull form and an inverter circuit I40 that complementarily controls the output MOSFETs $Q_{41}$, $Q_{42}$. The output signal S5 of the CMOS LSI 11 has a high level of 5 V−Vth (threshold voltage of the output MOSFET $Q_{41}$)=4 V and a low level of 0 V. When 4 V is output from the CMOS LSI 11, about 3.7 V is on the input of the ECL LSI, and when 0 V is output from the CMOS LSI, about 2.9 V is on the input of the ECL LSI.

The input interface 15 amplifiers the ECL high level (such as 3.7 V) and the ECL low level (such as 2.9 V) to the CMOS level (for example, 5 V and 0 V), and can hence be constituted by using the differential amplifiers SA1, SA2. In this case, the amplitude of the ECL input signal S1 is shifted toward the high-level side 3.7 V/2.9 V when the operation voltage VS1 of the CMOS LSI 11 is 5 V. Therefore, the differential amplifier SA1 should use n-channel differential MOSFETs, and the output differential amplifier SA2 should use p-channel differential MOSFETs or a CMOS inverter circuit.

Figure 15:
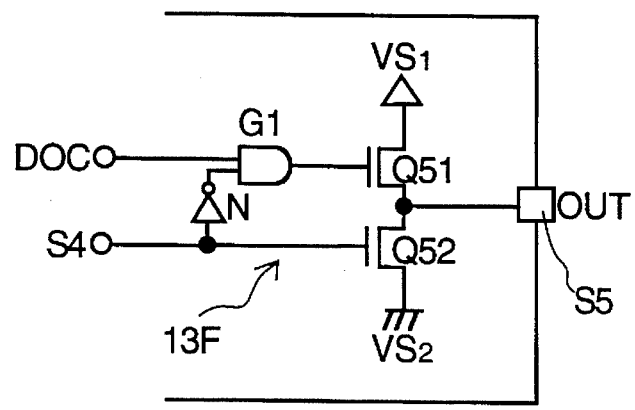
FIG. 15 is a diagram illustrating another variation of part of the output ECL interface of FIG. 12.

FIG. 15 is a diagram of another output interface 13F. The inverted push-pull output circuit is switched by a control signal DOC into an output circuit of the open-drain constitution. That is, an AND gate G1 is connected to the gate of the output MOSFET $Q_{51}$ of the high-level side. One input of the AND gate G1 receives the control signal DOC and the other input receives output signal S4 which is inverted through the inverter N. When the control signal DOC has the high level, the AND gate G1 transmits the output of the inverter N directly to the gate of the output MOSFET $Q_{51}$. Therefore, when the signal S4 has the high level, the output MOSFET $Q_{52}$ is turned on, and the output MOSFET $Q_{51}$ is turned off by a low from the inverter N, causing the output terminal OUT to go low. When the signal S4 has the low level, the output MOSFET $Q_{52}$ is turned off and the output MOSFET $Q_{51}$ is turned on by the high from the inverter N, causing the output terminal OUT to become high. Thus, when the control signal DOC has the high level, the device operates as a push-pull output.

When the control signal C has the low level, the AND gate G1 goes low irrespective of the output of the inverter N, whereby the output MOSFET $Q_{51}$ is steadily off. Therefore, the device works as an output interface of the open-drain constitution due to the output MOSFET $Q_{52}$.

Therefore, when an LSI is to be connected to the output and constituted by CMOS integrated devices alone, the control signal DOC is high to provide the CMOS LSI with a push-pull output circuit. When the CMOS LSI is combined with the ECL LSI, the control signal DOC is low so that the output circuit is of the open-drain constitution.

In order to decrease noise superposed on the power source line of the output interface 13–13F, a plurality of output interfaces can be provided for every output terminal, and the signal S5 that is to be output can be delayed through delay circuits. This makes it possible to accomplish the same operation as that explained with respect to FIG. 11.

In FIGS. 12 to 14, the operation voltage (VS1–VS2) of the CMOS LSI 11 may be set to 4.5 V in conformity with the ECL LSI operating voltage in order to simplify the power source circuit. In general, the allowable voltage range of the LSIs is ±10. Therefore, the performance of the CMOS LSI internal circuit does not lower seriously even when the CMOS integrated circuit device is operated at 4.5 V.

While a preferred embodiment has been set forth along with modifications and variations to show specific advantageous details of the present invention, further embodiments, modifications and variations are contemplated within the broader aspects of the present invention, all as set forth by the spirit and scope of the following claims.

We claim:

1. A CMOS LSI, comprising:
   an input amplifier circuit receiving an input signal of the ECL level and outputting a CMOS level output signal;
   said input amplifier circuit comprising a p-channel type differential MOSFETs amplifier having a negative operation voltage corresponding to the ECL level and a positive operation voltage corresponding to an operation voltage of the CMOS circuit;
   said input amplifier circuit further comprises an n-channel type differential MOSFETs amplifier having a negative operation voltage corresponding to the ECL level and a positive operation voltage corresponding to the CMOS level and cascade connected with said p-channel type differential MOSFETs amplifier; and
   an output interface including a CMOS level output buffer circuit which receives a CMOS level signal.

2. A CMOS LSI according to claim 1, further comprising an internal data processing CMOS level circuit between said input amplifier circuit and said output interface; and
   wherein the output interface includes an n-channel open-drain output MOSFET which receives output from the internal data processing CMOS circuit.

3. A CMOS LSI according to claim 1, further including a transmission line, a series resistor coupled between an output of said buffer circuit and the transmission line, and terminating pull-up and pull down resistors on the transmission line.

4. A CMOS LSI according to claim 2, wherein said internal data processing CMOS level circuit has logic functions provided by programmed standardized logic blocks.

5. A CMOS LSI according to claim 1, wherein said negative operation voltage is –2 V and the positive operation voltage is about 3 V.

6. A CMOS LSI according to claim 2, wherein said negative operation voltage is –2 V and the positive operation voltage is about 3 V.

7. A CMOS LSI according to claim 3, wherein said negative operation voltage is –2 V and the positive operation voltage is about 3 V.

8. A CMOS LSI according to claim 4, wherein said negative operation voltage is –2 V and the positive operation voltage is about 3 V.

9. A CMOS integrated circuit according to claim 4, wherein said input amplifier circuit and said output interface have separate power source lines supplied with electric power through independent power source terminals.

10. A CMOS integrated circuit according to claim 5, wherein said input amplifier circuit and said output interface have separate power source lines supplied with electric power through independent power source terminals.

11. A CMOS LSI output interface for receiving an input signal fed via a CMOS level logic circuit and selectively outputting the input signal at a CMOS level or an ECL level, comprising:
    a first output n-channel MOSFET having a gate receiving the input signal;
    a second output n-channel MOSFET connected in series with said first output MOSFET; and
    a switching circuit switching operation of the second output MOSFET in response to a control signal to selectively operate said first and second output MOSFETs as a push-pull output circuit of CMOS level or as an open-drain output circuit of ECL level.

12. A data processing system comprising:
    an ECL integrated circuit;
    a CMOS integrated circuit operating at a CMOS level having a positive operation voltage;
    an ECL level to CMOS level input interface circuit connecting an output of said ECL integrated circuit to said CMOS integrated circuit, and including a p-channel differential MOSFET input stage amplifier which uses a reference negative operation voltage corresponding to the ECL level and a positive operation voltage corresponding to the positive CMOS level operation voltage of the CMOS integrated circuit and an n-channel differential amplifier for receiving an output from said input stage amplifier;

a CMOS to ECL level converter output interface which receives an output CMOS level signal from the CMOS integrated circuit and includes an n-channel open-drain output buffer; and said CMOS integrated circuit, said input interface circuit and said output interface being in a single electronic package.

13. A single package CMOS LSI, comprising:

a plurality of external terminals including a data input terminal, a data output terminal, a plurality of first voltage source terminals, and a plurality of second voltage source terminals;

an input interface circuit having an ECL level input directly connected to said data input terminal and an input interface circuit data output;

an internal data processing circuit having an input connected to said input interface circuit data output, and further having a processing circuit data output;

an output interface circuit having a data input connected to said processing circuit data output, and further having a data output directly connected to said data output terminal;

said input interface circuit having a first stage differential amplifier having an amplified data output and at least two power source wirings respectively connected directly and exclusively to respective ones of said first and second voltage source terminals;

said input interface circuit further having a second stage differential amplifier receiving the amplified data output of said first stage differential amplifier and outputting a CMOS level data signal to said internal data processing circuit, and further having two different power source wirings directly and exclusively connected to respective others of said first and second voltage source terminals different from said ones of first and second voltage source terminals; and said first and second stage differential amplifiers being connected in cascade for amplifying ECL level signals to a CMOS level.

14. A CMOS LSI according to claim 13, wherein one power source voltage for each of said first and second stage differential amplifiers is the same as one voltage of the ECL level.

15. A CMOS LSI according to claim 13, wherein said output interface circuit has a power source wiring directly connected to an external terminal different from an external terminal of the same voltage that is connected to said input interface circuit.

16. A CMOS LSI according to claim 13, wherein the power source wirings for said output interface circuit are physically separated from each other, in plan view of the LSI, by a different stable reference voltage wiring.

17. A CMOS LSI according to claim 13, wherein said input interface circuit has transistors formed in a plurality of wells in a substrate of the LSI and each well has only power source connections of each different voltage to respective different single ones of said power source wirings to avoid a latch up phenomena.

18. A CMOS LSI according to claim 13, wherein said input interface circuit includes means selectively bypassing said first and second stage amplifiers for data to change said input interface circuit from an ECL level input circuit to a CMOS level input circuit.

19. A CMOS LSI according to claim 13, further including two resistors series connected between ECL level voltage supplies and said data output terminal being connected between said two resistors.

20. A CMOS LSI according to claim 13, further including a power source surge protection MOS transistor connected between one of said voltage source terminals not connected to said input interface circuit and to the data input terminal for protecting said input interface circuit from voltage surges, with such connection of said MOS transistor being by wiring extending outside of a single chip including said input interface circuit.

21. A CMOS LSI according to claim 13, wherein all of said power source wirings are in wiring layers separate from wiring layers for connective wiring within said input interface circuit.

22. A CMOS LSI according to claim 21, wherein said power source wirings are divided in two separate wiring layers to one side of a wiring layer having connecting wire within said input interface circuit, and said power source wirings are arranged such that the most stable voltage power source wiring is in a wiring layer sandwiched between the wiring layer for the input interface circuit and the wiring layer for the least stable power source wiring connections.

23. A CMOS LSI according to claim 13, wherein said output interface circuit has push-pull transistors between different voltage sources and said data output terminal is connected between said push-pull transistors, one of said push-pull transistors having its gate provided with gate wiring to one of the different voltage sources connected to the other of said push-pull transistors and further provided with gate wiring connected to other circuit elements providing said output interface circuit with CMOS output capabilities, and one of said gate wirings being one of selectively cut or uncut to provide open drain ECL level output and the other of said gate wirings being one of selectively uncut or cut to provide CMOS level output.

24. A CMOS LSI, comprising:

a plurality of external terminals including a data input terminal, a data output terminal, a plurality of first voltage source terminals, and a plurality of second voltage source terminals;

an input interface circuit having an input directly connected to said data input terminal and an input interface data output;

an internal data processing circuit having an input connected to said input interface data output, and further having a processed data output;

an output interface circuit having a data input connected to said processed data output, and further having a data output connected to said output data terminal; and said output interface circuit having push-pull transistors between different voltage sources and said data output terminal is connected between said push-pull transistors, one of said push-pull transistors having its gate provided with gate wiring to one of the different voltage sources connected to the other of said push-pull transistors and further provided with gate wiring connected to other circuit elements providing said output interface circuit with CMOS output capabilities, and one of said gate wirings being one of selectively cut or uncut to provide open drain ECL level ECL output and the other of said gate wirings being one of selectively uncut or cut to provide CMOS level output.

25. A single chip CMOS LSI, comprising:

a plurality of external terminals including a data input terminal, a data output terminal, a plurality of first voltage source terminals, and a plurality of second voltage source terminals;

an input interface circuit having an input directly connected to said data input terminal and an input interface data output;

an internal data processing circuit having an input connected to said input interface data output, and further having a processed data output;

an output interface circuit having a data input connected to said processed data output, and further having a data output directly connected to said data output terminal;

said internal data processing circuit being a CMOS level circuit;

said input interface circuit being a staged differential amplifier circuit for converting ECL level input to CMOS level output; and wherein said output interface circuit is an ECL level output CMOS level input interface.

26. A single chip CMOS LSI, comprising:

a plurality of external terminals including a data input terminal, a data output terminal, a plurality of first voltage source terminals, and a plurality of second voltage source terminals;

an input interface circuit having an input interface input directly connected to said data input terminal and an input interface data output;

an internal data processing circuit having an input connected to said input interface data output, and further having a processed data output;

an output interface circuit having a data input connected to said processed data output, and further having a data output directly connected to said data output terminal; and said input interface circuit having an ECL level input to CMOS level output first circuit connected in parallel with a CMOS level input to CMOS level output second circuit between said input interface input and said input interface output, and a switching circuit to switch said first and second circuits between said input interface input and said input interface data output.

27. A single chip CMOS LSI, comprising:

a plurality of external terminals including a data input terminal, a data output terminal, a plurality of first voltage source terminals, and a plurality of second voltage source terminals;

an input interface circuit having an input directly connected to said data input terminal and an input interface data output;

an internal data processing circuit having an input connected to said input interface data output, and further having a processed data output;

an output interface circuit having a data input connected to said processed data output, and further having a data output directly connected to said data output terminal; and said output interface circuit having a CMOS level input to CMOS level output first circuit and a CMOS level input to ECL level output second circuit, and destructively programmable circuits to selectively permanently enable one of said first and second circuits between said data input and output of said output interface circuit and permanently disable the other of said first and second circuits.

* * * * *